United States Patent [19]

Nakamura

[11] Patent Number: 5,008,638

[45] Date of Patent: Apr. 16, 1991

[54] INSTALLATION STRUCTURE OF A MICROWAVE OSCILLATION CIRCUIT UNIT

[75] Inventor: Makio Nakamura, Osaka, Japan

[73] Assignee: Sharp Kabushiki Kaisha, Osaka, Japan

[21] Appl. No.: 362,506

[22] Filed: Jun. 7, 1989

[30] Foreign Application Priority Data

Jun. 8, 1988 [JP] Japan .............................. 63-76160[U]

[51] Int. Cl.⁵ ............................................ H03B 1/00
[52] U.S. Cl. ...................................... 331/68; 331/187
[58] Field of Search .................. 331/68, 187; 361/400; 174/52.1, 52.5

[56] References Cited

U.S. PATENT DOCUMENTS 4,091,232  5/1978  Lenk et al. ......................... 331/68 X Primary Examiner—David Mis Attorney, Agent, or Firm—Birch, Stewart, Kolasch & Birch

[57] ABSTRACT

A microwave oscillation circuit unit to be installed on one surface of a chassis base having a circuit substrate on its other surface. The unit is provided with at least two screws, and a power supply terminal and an output terminal on its one surface confronting the chassis base when installed on the chassis base. In such a structure, a first nut is threaded on one of the screws which is positioned adjacent to the power supply terminal and the output terminal so that torque caused by tightening the first nut to such one of the screws may act upon the chassis base, the first nut being clear from the circuit substrate. Furthermore, a second nut is threaded on the other of the screws which is positioned apart from both the terminals so that torque caused by tightening the second nut to the other of the screws acts upon both the chassis base and the circuit substrate.

1 Claim, 3 Drawing Sheets

INSTALLATION STRUCTURE OF A MICROWAVE OSCILLATION CIRCUIT UNIT

BACKGROUND OF THE INVENTION

1. Field of the Invention

The present invention relates to the improvement in the installation structure for a microwave oscillation circuit unit for use in a low noise converter for satellite broadcasting use or the like.

2. Description of the Prior Art

A microwave oscillation circuit unit is generally formed with the use of a metallic box internally provided with an oscillation circuit and is installed on a chassis base by means of specified screws.

FIGS. 1 and 2 and FIGS. 3 and 4 depict conventional installation structures of a microwave oscillation circuit unit.

In FIGS. 1 and 2, the microwave oscillation circuit unit 3 is installed on a lower surface of a chassis base 6, with an earth plate 9 interposed between them. The chassis base 6 is provided on its upper surface with a circuit substrate 7 having openings 8 for receiving therein respective washers 10 and nuts 11, which are threaded on the screws 1 and 2 of the unit 3. The unit 3 is fixedly mounted on the chassis base 6 by tightening the nuts 11. In this event, since the washer 10 are in abutment with the chassis base 6, torque caused by tightening the nuts 11 acts upon the chassis base 6.

On the other hand, in the structure shown in FIGS. 3 and 4, the washers 10 abut on the circuit substrate 7. Accordingly, the torque caused by tightening the nuts 11 acts upon the circuit substrate 7.

In both the structures of FIGS. 1 and 2 and FIGS. 3 and 4, a power supply terminal 4 and an output terminal 5 of the unit 3 are soldered to respective conductor patterns 12 and 13 formed on the circuit substrate 7.

In the structure of FIGS. 1 and 2, the torque control required for the proper tightening is not so difficult. However, since the circuit substrate 7 is not restricted by the tightening, it is very likely that the circuit substrate 7 would lift from the chassis base 6. This phenomenon takes place when a relatively soft circuit substrate, of for example Teflon, is subjected to deflection caused by heat treatment during a soldering process for chip components and the like. Such lifting is substantially rectified by depressing the circuit substrate 7, particularly in the vicinity of the terminals 4 and 5, or by providing additional tightening portions of the circuit substrate 7 to the chassis base 6, when the power supply terminal 4 and the output terminal 5 are soldered. Accordingly, this structure is disadvantageous due to such increased incidental work or in that circuit pattern design would be restricted to some extent.

On the other hand, the structure as shown in FIGS. 3 and 4 can practically prevent the lifting of the circuit substrate 7 from the chassis base 6 but cannot be applied to a chassis base 6 having thereon a soft circuit substrate of Teflon or the like. The reason for this is that torque control required for the proper tightening between the nuts 11 and the screws 1 and 2 is hardly possible with respect to the soft circuit substrate. Furthermore, the circuit substrate 7 is subject to shrinking under severe circumstances in which the change in temperature or humidity is relatively large. Accordingly, this structure cannot guarantee the proper tightening because the thickness of the circuit substrate 7 changes due to deterioration with age.

These drawbacks cause several problems. For example, the above described structure occasionally brings about a change in distributed capacitance, followed by a large fluctuation of an oscillation frequency, impossibility of effective supply of an oscillation output, large radiation of the oscillation output towards the outside or the like.

SUMMARY OF THE INVENTION

Accordingly, the present invention has been developed with a view to substantially eliminating the above described disadvantages inherent in the prior art installation structure for a microwave oscillation circuit unit, and has for its essential object to provide an improved installation structure which enables the microwave oscillation circuit unit to supply a stabilized oscillation frequency and a stabilized oscillation output.

Another important object of the present invention is to provide an installation structure of the above described type which can prevent the oscillation circuit unit from radiating the oscillation output outside.

In accomplishing these and other objects, a microwave oscillation circuit unit to which the present invention is applied is installed on one surface of a chassis base having a circuit substrate on its other surface. The unit is provided with at least two screws, a power supply terminal and an output terminal on its one surface confronting the chassis base when installed on the chassis base. In the installation structure, according to the present invention, a first nut is threaded on one of the screws which is positioned adjacent to the power supply terminal and the output terminal so that torque caused by tightening the first nut on the screw may act upon the chassis base and the first nut may be clear from the circuit substrate. Furthermore, a second nut is threaded on the other or second of the screws which is positioned apart from the power supply terminal and the output terminal so that the torque caused by tightening the second nut on the second screw may act upon both the chassis base and the circuit substrate.

In such an installation structure of the microwave oscillation circuit unit, torque control can be performed with respect to the nut threaded on the screw disposed adjacent to the power supply terminal and the output terminal. Accordingly, the installation of the oscillation circuit unit on the chassis base can be placed under control. Furthermore, the lifting of the circuit substrate from the chassis base can be prevented by tightening the nut to the screw disposed apart from both the terminals. In addition, installation conditions of the oscillation circuit unit on the chassis base hardly change even when the thickness of the circuit substrate changes under severe circumstances in which the change in temperature or in humidity is relatively large.

BRIEF DESCRIPTION OF THE DRAWINGS

These and other objects and features of the present invention will become more apparent from the following description taken in conjunction with the preferred embodiment thereof with reference to the accompanying drawings, throughout which like parts are designated by like reference numerals, and wherein.

DETAILED DESCRIPTION OF THE PREFERRED EMBODIMENTS

Figure 5:
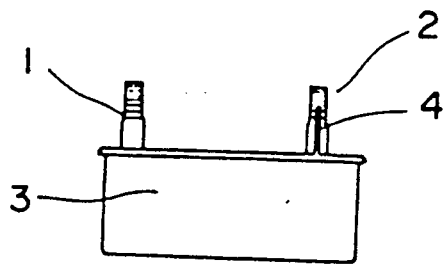
FIG. 5 is an elevational view of a microwave oscillation unit to which the present invention is applied.
Figure 6:
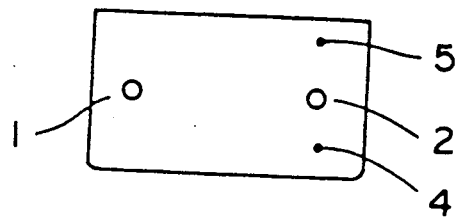
FIG. 6 is a top plan view of the unit of FIG. 5.

FIGS. 5 and 6 depict a microwave oscillation circuit unit 3 to which the present invention is applied. The oscillation circuit unit 3 is provided on its upper surface with two screws 1 and 2, a power supply terminal 4 and an output terminal 5.

Figure 7:
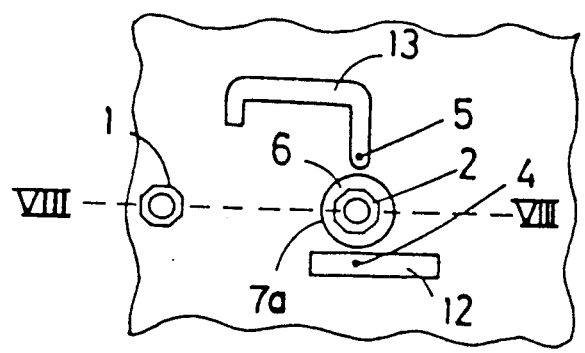
FIG. 7 is a top plan view of an installation structure for the microwave oscillation unit according to one preferred embodiment of the present invention.
Figure 8:
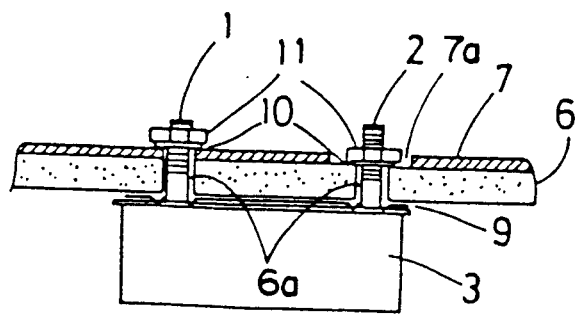
FIG. 8 is a section taken along the line VIII—VIII in FIG. 7.

FIGS. 7 and 8 depict an installation structure for the oscillation circuit unit 3 according to one preferred embodiment of the present invention.

Figure 1:
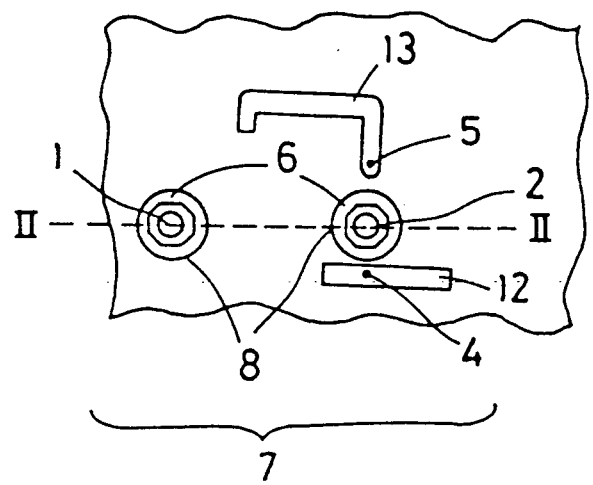
FIG. 1 is a top plan view of a conventional installation structure for a microwave oscillation circuit unit.
Figure 2:
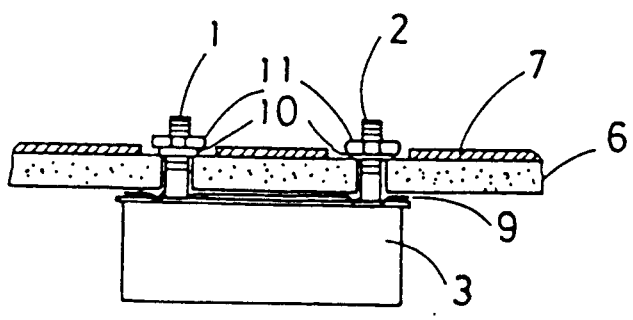
FIG. 2 is a section taken along the line II—II in FIG. 1.
Figure 3:
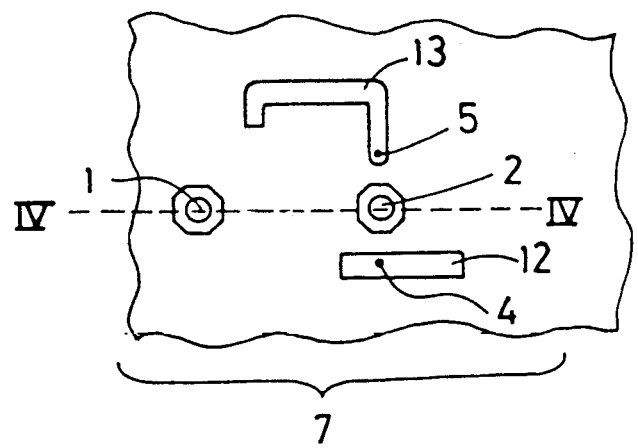
FIG. 3 is a top plan view of another conventional installation structure for a microwave oscillation circuit unit.
Figure 4:
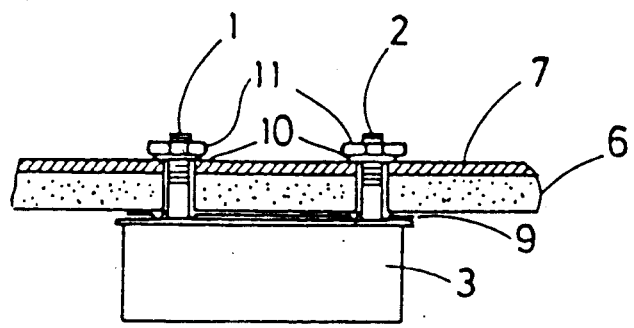
FIG. 4 is a section taken along the line IV—IV in FIG. 3.

In the structure of FIGS. 7 and 8, an earth plate 9 is initially mounted on the oscillation circuit unit 3 by extending the screws 1 and 2 through openings formed in the earth plate 9. Subsequently, a chassis base 6 having thereon a circuit substrate 7 is mounted on the earth plate 9 by extending the screws 1 and 2 through respective openings 6a and 7a formed in the chassis base 6 and the circuit substrate 7. A nut 11 together with a washer 10 is then tightened with appropriate torque with respect to the screw 2 disposed adjacent to the power supply terminal 4 and the output terminal 5. A torque controllable means, such as a torque wrench or the like, is used for tightening the nut to any desired torque. In this event, the nut 11 and the washer 10 are clear from the circuit substrate 7 and the washer 10 is in abutment with the chassis base 6, since an inner diameter of the opening 7a of the circuit substrate 7 is larger than an outer diameter of the nut 11 and that of the washer 10. Accordingly, torque caused by tightening the nut 11 acts upon the chassis base 6, and therefore, torque control for this nut 11 is relatively easy, as well as the structure as shown in FIGS. 1 and 2. Thereafter, a nut 11 along with a washer 10 is tightened from above the circuit substrate 7 with respect to the screw 1 which is positioned apart from the power supply terminal 4 and the output terminal 5. The torque for tightening the nut 11 to the screw 1 is so regulated as to comply with the material of the circuit substrate 7 regardless of the chassis base 6. In this way, the oscillation circuit unit 3 is fixed to the chassis base 6. Finally, the power supply terminal 4 and the output terminals 5 are soldered to respective conductor patterns 12 and 13 formed on the circuit substrate 7.

According to the present invention, since the torque caused by tightening the nut 11 with respect to the screw 1 acts upon the circuit substrate 7, the lifting of the circuit substrate 7 from the chassis base 6 is prevented. Accordingly, not only is work for preventing such lifting not required but the circuit pattern design is not subjected to any restriction, thus resulting in improved workability followed by reduced production cost.

Furthermore, torque control can be performed with respect to the screw 2 disposed adjacent to the power supply terminal 4 and the output terminal 5, thus facilitating the management required for the installation of the oscillation circuit unit 3 on the chassis base 6.

Although the present invention has been fully described by way of examples with reference to the accompanying drawings, it is to be noted here that various changes and modifications will be apparent to those skilled in the art. Therefore, unless such changes and modifications otherwise depart from the spirit and scope of the present invention, they should be construed as being included therein.

What is claimed is:

1. In an installation structure for installing a microwave oscillation circuit unit on one surface of a chassis base having a circuit substrate on its other surface, said unit having at least two screws, a power supply terminal and an output terminal on its one surface confronting the chassis base when installed on the chassis base, the improvement comprising a first nut to be threaded on one of the screws which is positioned adjacent to the power supply terminal and the output terminal so that torque caused by tightening said first nut to said one of the screws acts upon the chassis base and said first nut is clear from the circuit substrate; and a second nut to be threaded on the other of the screws which is positioned apart from the power supply terminal and the output terminal so that torque caused by tightening said second nut to said the other of the screws acts upon both the chassis base and the circuit substrate.

* * * * *